United States Patent
Fischer et al.

(10) Patent No.: US 7,795,949 B2
(45) Date of Patent: Sep. 14, 2010

(54) CIRCUIT FOR SWITCHING A VOLTAGE-CONTROLLED TRANSISTOR

(75) Inventors: Klaus Fischer, Friedberg (DE); Josef Kreittmayr, Bobingen (DE)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 80 days.

(21) Appl. No.: 12/279,582

(22) PCT Filed: Feb. 16, 2007

(86) PCT No.: PCT/EP2007/051515

§ 371 (c)(1),
(2), (4) Date: Aug. 15, 2008

(87) PCT Pub. No.: WO2007/096305

PCT Pub. Date: Aug. 30, 2007

(65) Prior Publication Data

US 2009/0066400 A1    Mar. 12, 2009

(30) Foreign Application Priority Data

Feb. 21, 2006 (DE) .................. 20 2006 002 762 U

(51) Int. Cl.
*H03K 17/687* (2006.01)
(52) U.S. Cl. .................. 327/427; 327/432; 327/433; 327/478
(58) Field of Classification Search .................. None
See application file for complete search history.

(56) References Cited

U.S. PATENT DOCUMENTS 5,546,043 A * 8/1996 Pollmeier .................. 327/427
6,218,873 B1 * 4/2001 Murr .......................... 327/109

FOREIGN PATENT DOCUMENTS

| DE | 37 12 998 | 11/1988 |
| DE | 196 38 619 | 4/1998 |
| GB | 2 238 437 | 5/1991 |
| JP | 06 244698 | 9/1994 |

* cited by examiner

*Primary Examiner*—Tuan Lam
(74) *Attorney, Agent, or Firm*—Cohen Pontani Lieberman & Pavane LLP

(57) ABSTRACT

A circuit including a voltage-controlled transistor to be switched. A first transistor is switched on, mediated by a control signal, and a first current flows through a series circuit and starts to subject a control input of the voltage-controlled transistor to charge reversal. The first current brings about a first potential shift at a connecting node. A second transistor is switched on by this first potential shift and a second current therefore flows through the switching path of the second transistor into the control input of the first transistor, which amplifies the first current. The increasing charge reversal of the control input of the voltage-controlled transistor brings about a second potential shift at the connecting node, the second transistor is switched off by this second potential shift, and the first transistor remains switched on, however, and holds the voltage-controlled transistor in its new switching state.

12 Claims, 2 Drawing Sheets

CIRCUIT FOR SWITCHING A VOLTAGE-CONTROLLED TRANSISTOR

RELATED APPLICATIONS

This is a U.S. national stage of application No. PCT/EP2007/051515, filed on Feb. 16, 2007.

This application claims the priority of German patent application no. 20 2006 002 762.9 filed Feb. 21, 2006, the content of which is hereby incorporated by reference.

FIELD OF THE INVENTION

The present invention relates to a circuit comprising a voltage-controlled transistor which is to be switched.

BACKGROUND OF THE INVENTION

Voltage-controlled transistors are known and used in many ways. They can be embodied for example as a FET, in particular MOSFET, or IGBT. Voltage-controlled transistors have a control input, which influences the switching path of the transistor depending on its voltage with respect to a reference potential. By way of example, a negative charging of the control input (gate in the case of a MOSFET) can prevent the movements of conduction electrons through the switching path of the transistor (between drain and source) and thus turn the transistor off or, if said transistor is regarded as a switch, open it.

Voltage-controlled transistors are often used for switching relatively large powers. However, the switching instants are usually determined by means of signal processing electronics with only a low power conversion. The control inputs of voltage-controlled transistors cannot be switched arbitrarily rapidly by correspondingly weak signals on account of their input capacitance.

Therefore, a (driver) circuit that is triggered by the weak signals is usually used for switching the voltage-controlled power transistors. For this purpose, such circuits have their own power supply, which they use to generate correspondingly strong switching signals.

A simple circuit for switching a voltage-controlled transistor with an operational amplifier is presented by way of example here. It comprises an operational amplifier having an open collector output, at which one of two states can be present. In one state, the output of the operational amplifier is connected to a reference-ground potential at low impedance; in the other state, the output of the operational amplifier is isolated from said potential at high impedance. These states can be referred to as logic zero and logic one. A DC voltage supply can be used for switching a voltage-controlled transistor. In this case, a first resistor, a so-called "pull-up resistor", is connected between a supply potential of a DC voltage supply and the output of the operational amplifier. The output of the operational amplifier is connected to the control input of the voltage-controlled transistor. If the output of the operational amplifier is at low impedance (logic zero), then the control input of the voltage-controlled transistor is subjected to charge reversal to the reference-ground potential via the operational amplifier. If the output of the operational amplifier is at high impedance (logic one), then the control input of the voltage-controlled transistor is connected to the supply potential of the DC voltage supply via the "pull-up resistor" and can be subjected to charge reversal via said supply. Depending on the polarity of the DC voltage supply and the construction of the voltage-controlled transistor, this can correspond to the switching path of said transistor being switched on or off.

SUMMARY OF THE INVENTION

One object of the present invention is to provide a circuit which is improved with regard to the switching of a voltage-controlled transistor.

This object is achieved by means of a circuit comprising a voltage-controlled transistor, which circuit has a first and a second supply potential, a first and a second transistor, and an impedance, wherein a series circuit formed by the switching path of the first transistor and the impedance is connected between the first supply potential and the control input of the voltage-controlled transistor, wherein the impedance is connected in a manner facing the first supply potential, the first supply potential is connected to the control input of the first transistor via the switching path of the second transistor, the control input of the second transistor is connected up to a connecting node between the impedance and the switching path of the first transistor in such a way that a potential change at the connecting node can switch the second transistor, and wherein the circuit is designed in such a way that, as a result of the first transistor being switched on in a manner mediated by means of a control signal, a first current flows through the series circuit and starts to subject the control input of the voltage-controlled transistor to charge reversal in a first sense, the first current through the series circuit brings about a first potential shift at the connecting node, the second transistor is switched on by this first potential shift and a second current therefore flows through the switching path of the second transistor into the control input of the first transistor, which amplifies the first current, the increasing charge reversal of the control input of the voltage-controlled transistor brings about a second potential shift at the connecting node, the second transistor is switched off by this second potential shift, and the first transistor remains switched on, however, and holds the voltage-controlled transistor in its new switching state.

Taken into consideration is that voltage-controlled transistors designed as power switches have a large input capacitance at their control input. Even in combination with resistors present in a (driver) circuit, large charge-reversal time constants can arise, on account of which the control input of the voltage-controlled transistor cannot be subjected to charge reversal sufficiently rapidly. It may furthermore be the case that resistors present in the circuit, such as the above-mentioned pull-up resistor, for example, cannot be made arbitrarily small.

One aspect of the invention proceeds from the aim of enabling a low-impedance charge-reversal path for the charge reversal of the control input of a voltage-controlled transistor. However, a low-impedance charge-reversal path can also have a disturbing effect on the operational reliability or operational quality of a circuit that drives the voltage-controlled transistor. By way of example, if the low-impedance charge-reversal path is enabled for charging the capacitive control input, then a low-impedance connection exists between one of the supply potentials and the control input of the voltage-controlled transistor in order to rapidly charge the latter. If the low-impedance connection between the aforementioned supply potential and the control input is maintained while the control input is discharged, then a short circuit between the two supply potentials can occur.

Taken into consideration is the further idea of not only enabling a low-impedance charge-reversal path but also designing the latter in such a way that a low-impedance current path between the supply potentials does not arise in the case of renewed charge reversal in the opposite sense.

According to an embodiment of the invention, as a result of the first transistor being switched on in a manner mediated by means of a control signal, a first current is fed to the control input of the voltage-controlled transistor. The control signal can be generated for example by an operational amplifier having an open collector output by a change in the output impedance from low impedance to high impedance in conjunction with a pull-up resistor.

The switching path of the first transistor is connected together with an impedance in series between the first supply potential and the control input of the voltage-controlled transistor. On account of the current then flowing through the first transistor, the potential between the first transistor and the impedance connected in a manner facing the first supply potential is shifted in the direction of the second supply potential. The control input of the second transistor is connected up to the connecting node between the impedance and the first transistor, such that this first potential shift switches on the second transistor. Since the switching path of the second transistor is connected between the first supply potential and the control input of the first transistor, a charge-reversal path having a very low impedance overall is then enabled. The current through the switching path of the second transistor amplifies the current through the switching path of the first transistor. The input capacitance of the voltage-controlled transistor can thus be subjected to charge reversal very rapidly. The increasing charge reversal of the control input of the voltage-controlled transistor then has the effect, however, that the potential at the node between the first transistor and the impedance connected in series with the latter is shifted again in the direction of the first supply potential. The second transistor is switched off again by this second potential shift.

The low-impedance path through the second transistor to the control input of the first transistor has thus concomitantly caused its own switch-off as a result of the rapid charging—concomitantly brought about by it—of the control input of the voltage-controlled transistor. The first transistor remains switched on, however, such that the voltage-controlled transistor remains in its new switching state.

If, by way of example, the input capacitance of the voltage-controlled transistor is then subjected to charge reversal in the opposite sense via the output—connected at low impedance—of an operational amplifier having an open collector output, then the path through the second transistor does not constitute a low-impedance path for a short-circuit of the supply voltage.

A circuit according to an embodiment of the invention has a first capacitor connected between the abovementioned connecting node (between the first transistor and the impedance in series therewith) and the control input of the second transistor, which first capacitor is subjected to charge reversal by the first potential shift on account of the switching on of the first transistor via a resistor in series with the first capacitor in such a way that it supports the switching off of the second transistor via the second potential shift on account of the progressive charge reversal of the input capacitance of the voltage-controlled transistor. For this purpose, the first capacitor can be connected up to the control input of the second transistor and the resistor connected in series with the first capacitor can be connected up between the first capacitor and the connecting node.

For rapid voltage changes, the first capacitor constitutes a short circuit. Therefore, the second transistor is switched on directly after the switching on of the first transistor.

The capacitance of the first capacitor and the resistance of the resistor connected in series with the first capacitor are chosen such that the first capacitor can be charged in the time in which the control input of the voltage-controlled transistor is subjected to charge reversal sufficiently. In this case, the resistor connected in series with the first capacitor prevents the first capacitor from being subjected to charge reversal too rapidly. If the first capacitor were subjected to charge reversal too rapidly, then the second transistor would be switched off again prematurely and the acceleration of the switching of the voltage-controlled transistor by the second transistor would be prevented or at least not as great as possible.

The first capacitor supports the switching off of the second transistor as follows: if the first and the second transistor are initially open, then the connecting node and thus the control input of the second transistor are at the potential of the first supply potential. If the first transistor is switched on, then the potential of the connecting node is shifted in the direction of the second supply potential. In this case, the first capacitor connected between the connecting node and the control input of the second transistor is subjected to charge reversal via the series-connected resistor. By means of the second potential shift at the connecting node, however, the charging of the first capacitor is ended and the voltage at the control input of the second transistor moves towards the first supply potential again. As a result of the first capacitor already having been subjected to charge reversal, the potential at the control input of the second transistor can leave the range between the first and second supply potential and pass in the direction of the first supply potential beyond the latter. By way of example, if the first supply potential is positive and the second supply potential is negative, then a potential which is higher than the positive supply potential may be present at the control input of the second transistor after the second potential shift.

If, in this example, the second transistor is for instance a pnp-transistor which has its emitter connected to the positive supply potential and its base connected to the first capacitor, then a negative voltage is present across the base-emitter diode after the second potential shift. The second transistor then reliably turns off and is rapidly desaturated.

A rapid desaturation is advantageous since, in the case of a renewed switching of the voltage-controlled transistor in the opposite sense, the charge carriers that remained in the second transistor can form the basis of a short-circuit current between the supply potentials (see exemplary embodiment).

If a gate leakage current occurs from the control input of the voltage-controlled transistor to the second supply potential, then the potential at the connecting node cannot reach the first supply potential. A reliable switching off of the second transistor can nevertheless be ensured by the charge reversal of the first capacitor.

A resistor can be connected between the control input of the second transistor and the first supply potential (also see the explanations concerning claim 9).

If there is no capacitor connected between the control input of the second transistor and the connecting node and a gate leakage current occurs, then a voltage is permanently dropped at said resistor on account of the gate leakage current, which can lead to an unintentional permanent switching on of the second transistor. If the first capacitor is connected in series with said resistor, then the gate leakage current no longer causes a voltage drop at said resistor in the long term on account of the charge reversal of the first capacitor.

The aforementioned resistor is designed such that a sufficiently large voltage drop for switching on the second transistor is generated at it on account of the current flowing through it owing to the first potential shift.

The threshold value of a bipolar transistor may be temperature-dependent. By way of example, in the case of a bipolar pnp-transistor, the threshold value is approximately 0.8 V at −30° C., while it is approximately 0.4 V at 130° C.

In order in this example, without a capacitor between the control input of the second transistor and the connecting node, to ensure a reliable switching on of the bipolar transistor even in the case of a maximum threshold value, the resistor connected between the control input of the second transistor and the first supply potential would have to have a comparatively high value. This can have the effect that, however, at further temperatures, if the threshold value of the second transistor is lower, the latter is switched on too readily. If the first capacitor were not connected between the control input of the second transistor and the connecting node, then possibly even smaller gate leakage currents through said resistor could switch on the second transistor. If it is present, however, then in the charged state it prevents the influence of a possible gate leakage current.

Preferably, the resistor connected in series with the first capacitor is designed in such a way that the charging time of the first capacitor is shorter than the minimum duration for which the voltage-controlled transistor stays in the new switching state. The second transistor is thus reliably switched off before the voltage-controlled transistor is subjected to charge reversal again (in the opposite sense).

A possible (depending on circuit arrangement, see exemplary embodiments) short-circuit between the supply potentials through the switching path of the second transistor and a switching path for switching off the voltage-controlled transistor can thus be prevented even in the case of short durations for which the voltage-controlled transistor stays in its switching states. It is advantageous also to take account of the depletion time of the second transistor and to choose the sum of the charging time of the first capacitor and the depletion time of the second transistor to be less than the minimum duration for which the voltage-controlled transistor stays in the new switching state.

For this purpose, here as well the first capacitor can be connected up to the control input of the second transistor and the resistor connected in series with the first capacitor can be connected between the first capacitor and the connecting node.

Preferably, the first transistor is switched on via an open collector output of an operational amplifier and a pull-up resistor. Small transistors such as the first or the second transistor can thus be switched simply and reliably.

If, for the first transistor, for instance a bipolar transistor is chosen which has its collector connected up to the connecting node and its emitter connected up to the control input of the voltage-controlled transistor, then during the charge reversal of the input capacitance of the voltage-controlled transistor in the second sense and the associated fast potential shift at emitter and base of the first transistor in the direction of the second supply potential, the potential at the collector of the first transistor also moves rapidly in the direction of the second supply potential. Such a potential shift can lead to a renewed undesirable switching on of the second transistor.

Preferably, therefore, the circuit according to the invention has a third transistor, the control input of which is capacitively connected up to the control input of the voltage-controlled transistor and the switching path of which is connected in series between the first supply potential and the control input of the second transistor, such that in the case of a potential shift in the direction of the second supply potential at the control input of the voltage-controlled transistor, the third transistor is switched on via its control input and an undesired switching on of the second transistor is prevented.

The switching path of the third transistor can be connected up directly to the control input of the second transistor; in this case, the third transistor can perform the function just described.

The switching path of the third transistor can, however, also be connected between the first supply potential and the connecting node between the first transistor and the impedance connected between the first supply potential and the first transistor. In this case, the third transistor can perform the function described above and, moreover, improve the discharging of the first capacitor. If the resistor connected in series with the first capacitor is in this case connected in a manner facing the connecting node, then the transistor is discharged via said resistor and the switching path of the third transistor.

In one preferred embodiment of the invention, the first capacitor is connected in a manner facing the control input of the second transistor and the resistor connected in series with the first capacitor is connected in a manner facing the connecting node. The switching path of the third transistor is connected between the first supply potential and a node between the first capacitor and the resistor. If the switching path of the third transistor is connected up this way, said transistor can perform the function described above and, moreover, discharge the first capacitor at low impedance. In this case, the discharge current of the first capacitor does not flow through the resistor between the first capacitor and the connecting node.

Preferably, the control input of the third transistor is connected up to the control input of the voltage-controlled transistor via a second capacitor. In order to increase the interference immunity, a resistor is connected in parallel with the second capacitor. Via said resistor, the third capacitor can be held permanently in the switched-on state as long as the input capacitance of the voltage-controlled transistor is not subjected to charge reversal again in the first sense.

For discharging the second capacitor, a first diode is preferably connected between the control input of the third transistor and the first supply potential. This first diode additionally prevents the situation in which the voltage between the control input of the third transistor and the first supply potential can reach impermissible values during the charge reversal of the input capacitance of the voltage-controlled transistor in the first sense. If the third transistor is for instance a bipolar transistor and the emitter of the third transistor is connected up to the first supply potential, then the first diode can prevent the breakdown voltage of the base-emitter diode of the third transistor from being reached.

For improving the discharging of the first capacitor, a second diode is preferably connected between the control input of the second transistor and the first supply potential. The second diode also prevents a situation in which the base-emitter voltage of the second transistor can assume impermissible values.

A resistor is preferably connected between the control input of the second transistor and the first supply potential. This increases the interference immunity of the circuit since, without such a resistor, even extremely small currents in the line with which the control input of the second transistor is connected up can initiate a switching on of said transistor. In order to enable the second transistor to be switched on, a specific minimum current must flow through the resistor. Furthermore, the first capacitor connected in series with the control input of the second transistor can also be discharged via said resistor.

In one preferred embodiment of the invention, a fourth transistor is connected with its switching path between the control input of the voltage-controlled transistor and the second supply potential. In this case, the control input of the fourth transistor is connected up to the open collector output of the operational amplifier in such a way that the open collector output can switch on the fourth transistor in order to subject the control input of the voltage-controlled transistor to charge reversal in the remaining second sense via the switching path of the fourth transistor.

By way of example, if the input capacitance of the voltage-controlled transistor is charged by means of the circuit according to the invention comprising the first and the second transistor, it is then discharged with the aid of the fourth transistor.

The current gain of the fourth transistor is utilized for the discharging, such that the input capacitance of the voltage-controlled transistor can be subjected to charge reversal with a current which is determined by the current-carrying capacity of the operational amplifier output and the current gain of the fourth transistor.

Although the charge reversal of the input capacitance of the voltage-controlled transistor with the aid of the fourth transistor permits an efficient charge reversal (in the second sense) of the input capacitance, it nevertheless requires a transistor. Therefore, in another preferred embodiment, the circuit has a third diode. The third diode is connected up to the control input of the voltage-controlled transistor in such a way that it can be connected between the control input of the voltage-controlled transistor and the second supply potential via a switching path in order to subject the input capacitance of the voltage-controlled transistor to charge reversal in the second sense. If the first transistor is driven for instance by means of an operational amplifier having an open collector output, the third diode can be connected between the control input of the voltage-controlled transistor and the open collector output of the operational amplifier.

Preferably, at least one of the transistors from the group of the first, the second, the third and the fourth transistor is a bipolar transistor, particularly preferably all of them. Bipolar transistors are particularly inexpensive.

The above and the following description of the individual features relates to the circuit according to the invention. Furthermore, it relates to a method—corresponding to the invention—for switching a voltage-controlled transistor. This holds true even without being explicitly mentioned in detail.

Another aspect of the invention is directed to a method for switching a voltage-controlled transistor with a circuit having the voltage-controlled transistor, a first and a second supply potential, a first and a second transistor, and an impedance, wherein a series circuit formed by the switching path of the first transistor and the impedance is connected between the first supply potential and the control input of the voltage-controlled transistor, wherein the impedance is connected in a manner facing the first supply potential, the first supply potential is connected to the control input of the first transistor via the switching path of the second transistor, the control input of the second transistor is connected up to a connecting node between the impedance and the switching path of the first transistor in such a way that a potential change at the connecting node can switch the second transistor, and the method has the following steps: switching on the first transistor by means of a control signal, charge reversal of the control input of the voltage-controlled transistor in a first sense with a first current flowing through the series circuit, bringing about a first potential shift by means of the first current through the series circuit at the connecting node, switching on the second transistor by means of said first potential shift, amplifying the first current by means of a second current flowing through the switching path of the second transistor into the control input of the first transistor, bringing abut a second potential shift at the connecting node by means of the increasing charge reversal of the control input of the voltage-controlled transistor, switching off the second transistor by means of said second potential shift, and holding the voltage-controlled transistor in its new switching state by holding the first transistor in the switched-on state.

BRIEF DESCRIPTION OF THE DRAWINGS

Figure 1:
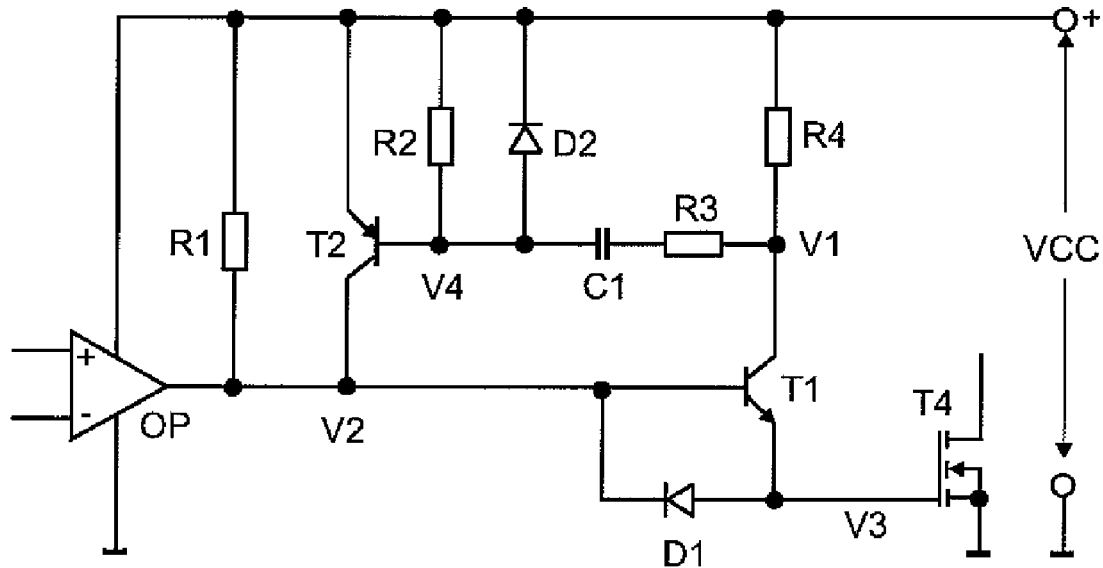
FIG. 1 shows the circuit diagram of a circuit according to the invention as a first exemplary embodiment.

FIG. 1 shows the circuit diagram of a circuit according to the invention comprising a voltage-controlled transistor T4.

The circuit is supplied by means of a DC voltage having a positive and a negative supply potential. The DC voltage supply serves here also for supplying an operational amplifier Op having an inverting input and a noninverting input, via which it receives signals from a signal-processing circuit (not shown). The output of the operational amplifier OP can assume two states here: a high impedance state (logic one) and a low impedance state (logic zero), wherein high impedance and low impedance respectively relate to the conductivity of the operational amplifier OP from the output with respect to the reference-ground potential, here the negative supply potential.

A first resistor R1, a diode D1 and the gate-source path of the voltage-controlled transistor T4, here a MOSFET, are connected in series between the positive and the negative supply potential. In this case, the source terminal of the MOSFET is connected to the negative supply potential.

The output of the operational amplifier OP is connected to a connecting node V2 between the diode D1 and the first resistor R1.

A series circuit comprising a resistor R4 and the collector-emitter path of a first bipolar transistor (npn) T1 is connected between the positive supply potential and a connecting node V3 between the diode D1 and the control input of the voltage-controlled transistor T4. The base of the first transistor T1 is likewise connected to the connecting node V2.

The emitter-collector path of a second transistor (pnp) T2 is connected between the positive supply potential and the base of the first transistor T1. In this case, the base of the second transistor T2 is connected via a series circuit comprising a capacitor C1 and a resistor R3 to a connecting node V1 between the resistor R4 and the first transistor T1. A resistor R2 is connected between the positive supply potential and a connecting node V4 between the base of the second transistor T2 and the capacitor C1. A diode D2 is connected in parallel with the resistor R2. The discharging of the capacitor C1 is improved by means of said diode D2.

The voltage-controlled transistor T4 is switched on by positive charging of its control input, i.e. gate, that is to say that its switching path (drain/source) turns on. Before the voltage-controlled transistor T4 is switched on, the output of the operational amplifier OP is logic zero, that is to say that the gate capacitance of the MOSFET T4 was discharged via the diode D1 and the output of the operational amplifier OP. The first transistor T1 turns off. The capacitor C1 is discharged since both sides are at positive supply potential. The second transistor T2 also turns off since both its emitter and its base are at the positive supply potential.

If the voltage-controlled transistor T4 is to be switched on, then the output of the operational amplifier OP acquires high impedance (logic one). The potential at the connecting node V2 is raised by the pull-up resistor R1. This means that the voltage across the base-emitter junction of the first transistor T1 also rises and switches on said transistor. A current through the resistor R4 and the collector-emitter path of the first transistor T1 starts to flow, such that the gate capacitance of the voltage-controlled transistor T4 is charged.

The potential at the collector of the first transistor T1, that is to say at the connecting node V1, falls as a result of the current flow through the resistor R4. This drop in potential encroaches on the base of the second transistor T2 via the capacitor C1 and the resistor R3. The voltage across the capacitor C1 cannot change abruptly; therefore, the voltage change at the base of second transistor T2 at the instant when the first transistor T1 is switched on, in a short period of time, corresponds to the voltage change at that terminal of the resistor R3 which is on the base side.

The emitter of the second transistor T2 is at the positive supply potential. As soon as the voltage dropped across the base-emitter junction of the second transistor T2 reaches the threshold value thereof, the second transistor T2 is also switched on and starts to carry a collector current. The collector current of the second transistor T2 is passed to the base of the first transistor T1, thereby accelerates the switching on thereof and amplifies the current conducted into the gate capacitance of the voltage-controlled transistor T4.

If C1 is regarded as a short circuit and R3 is disregarded, then the two transistors T1 and T2 here form a thyristor that is triggered by a positive voltage at the base of the first transistor T1. The gate capacitance of the voltage-controlled transistor T4 is charged very rapidly by the triggering of the thyristor T1, T2.

With increasing charging of the gate capacitance of the voltage-controlled transistor T4, the potential at the connecting node V3 or at the emitter of the first transistor T1 and at the collector of the first transistor T1 or at the connecting node V1 also rises. This has the effect, via the resistor R3 and the capacitor C1, that the base-emitter voltage of the second transistor T2 falls below the threshold value thereof and said transistor is switched off again. However, the second transistor T2 is not switched off instantaneously, but rather only after desaturation of its semiconductor depletion layers.

If the transistor T2 is switched off, the control input of the voltage-controlled transistor T4 remains switched on via the switched-on first transistor T1, the pull-up resistor R1 and the positive supply potential.

The second transistor T2 therefore firstly accelerates the charge reversal of the gate capacitance of the voltage-controlled transistor T4. The second transistor T2 used for the additional amplification is switched off again at the latest after complete charge reversal. The thyristor comprising the first and the second transistor T1, T2 is then turned off.

For switching off the voltage-controlled transistor T4, the output of the operational amplifier OP produces a low-impedance connection to the negative supply potential. The gate capacitance of the voltage-controlled transistor T4 is thereby discharged via the diode D1. The second transistor T2 has already been switched off and does not carry any collector current. Therefore, the output of the operational amplifier OP is acted upon only with the current through the pull-up resistor R1 and with the current required for discharging the gate capacitance of the voltage-controlled transistor T4. The base-emitter voltage of the first transistor T1 is negative and the first transistor T1 turns off. No short-circuit currents between the positive and the negative supply potential occur—in particular via the switching path of the second transistor.

The capacitor C1 improves the operation of the circuit according to the invention. While the gate capacitance of the voltage-controlled transistor T4 is charged and the voltage at the connecting node V1 is lower than the positive supply potential, the capacitor C1 is charged via the resistor R3. As a result of the increasing charging of the gate capacitance of the voltage-controlled transistor T4, the potential at the connecting point V1 rises again, however, and the charging of the capacitor C1 is ended. The potential at the base of the second transistor T2 also rises again. The base-emitter voltage of said transistor thus decreases. Since the capacitor C1 is charged, however, the potential at the base of the second transistor can rise above the positive supply potential; the second transistor T2 is therefore switched off particularly reliably and its desaturation is accelerated.

A gate leakage current can occur from the control input of the voltage-controlled transistor T4 to the negative supply potential. A current then still flows through the switching path of the first transistor T1, albeit a comparatively smaller current, and the potential at the connecting node V1 does not completely reach the level of the positive supply potential.

The capacitor C1 prevents, as a result of its charge reversal, the flow of that part of the gate leakage current which otherwise flows through the resistor R2. Accordingly, no voltage is dropped across the base-emitter junction of the second transistor T2 and the latter is reliably switched off.

Furthermore, the complex impedance of the capacitor C1 is of interest for operation that is robust with regard to the temperature. The threshold value of bipolar transistors depends on the ambient temperature. Thus, the threshold value of a pnp transistor is approximately 0.8 V at −30° C., while it is approximately 0.4 V at 130° C. Without the capacitor C1, the resistor R2 would have to be designed such that the current flowing through the resistor R2 generates a sufficiently large voltage drop at the second transistor T2 even in the case of the maximum threshold value of said transistor. For this purpose, the resistor R2 would have to have a correspondingly high value. If the threshold value were lower, however, the second transistor T2 would be switched on too readily in the case of a high-value resistor R2, such that the circuit overall becomes susceptible to interference.

The charging time of the capacitor C1 is set via the resistor R3 in such a way that the capacitor C1 is charged in the time in which the control input of the MOSFET T4 is charged sufficiently. On the other hand, the sum of the charging time of the capacitor C1 and the depletion time of the second transistor T2 is shorter than the minimum switched-on duration of the MOSFET T4, such that in the case of switching off the MOSFET T4, the output of the operational amplifier is not acted upon with a current flowing through the second transistor T2.

Figure 2:
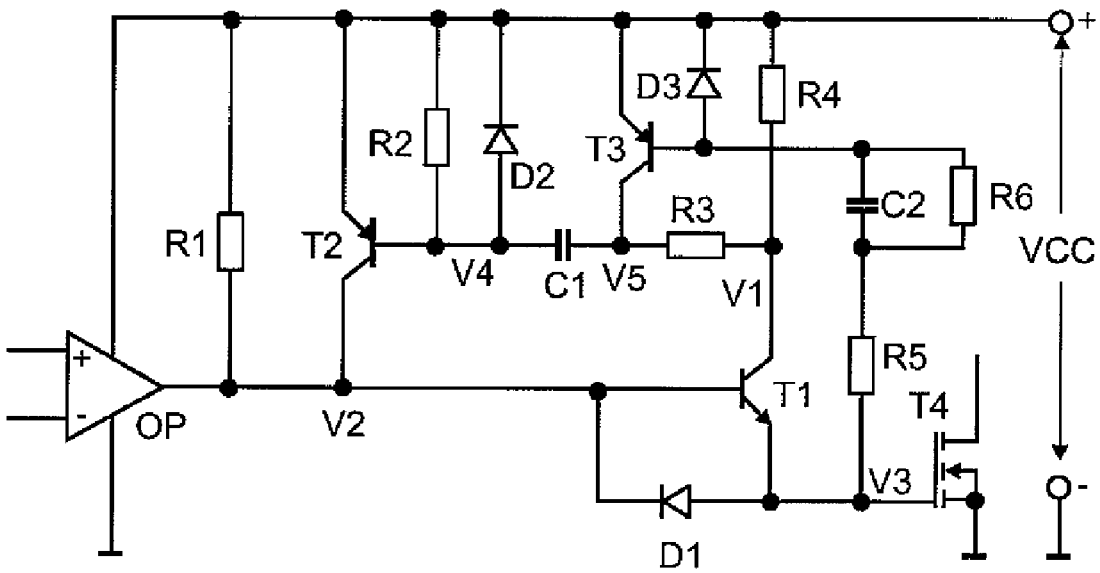
FIG. 2 shows the circuit diagram of a variation of the circuit from FIG. 1 as a second exemplary embodiment.

FIG. 2 shows the circuit diagram of a variation of the circuit shown in FIG. 1. The circuit shown in FIG. 1 has been modified only slightly and supplemented by a few components. Components which here have the same function as in the circuit shown in FIG. 1 also still bear the same reference symbols.

In contrast to FIG. 1, a further transistor T3 is connected in parallel with the capacitor C1 and the resistor R2. In this case, its emitter is connected to the positive supply potential and its collector is connected to a connecting node V5 between the capacitor C1 and the resistor R3. The base of the transistor T3 is connected to the control input of the voltage-controlled transistor T4 via a series circuit comprising a capacitor C2 and a resistor R5. A resistor R6 is connected in parallel with the capacitor C2 and a diode D3 is connected in parallel with the base-emitter junction of the transistor T3.

It has been found that in the case of the turn-off of the voltage-controlled transistor T4 and the associated rapid decrease in the potential at the emitter and the base of the first transistor T1, the collector voltage of the first transistor T1 also falls. This drop in potential can lead to an undesirable switching on of the second transistor T2 via the resistor R3 and the capacitor C1. This is intended to be prevented by the transistor T3. For this purpose, its base is capacitively connected to the control input of the voltage-controlled transistor T4.

If the potential at the connecting node V3 falls, then the transistor T3 is switched on via the capacitor C2. A sufficient voltage for switching on the second transistor T2 cannot then build up via the resistor R2.

In the case of a rise in the potential at the connecting node V3, that is to say at the control input of the voltage-controlled transistor T4, the transistor T3 is switched off. The capacitor C2 can be discharged via a diode D3 connected in parallel with the base-emitter junction of the transistor T3. The diode D3 furthermore prevents the base-emitter voltage of the transistor T3 from exceeding the breakdown voltage of the base-emitter diode of the transistor T3 when the voltage-controlled transistor T4 is switched on.

A resistor RG is connected in parallel with the capacitor C2, and the interference immunity can be improved further with said resistor. The transistor T3 can remain switched on via the resistor R6 as long as the gate capacitance of the voltage-controlled transistor T4 is discharged.

Figure 3:
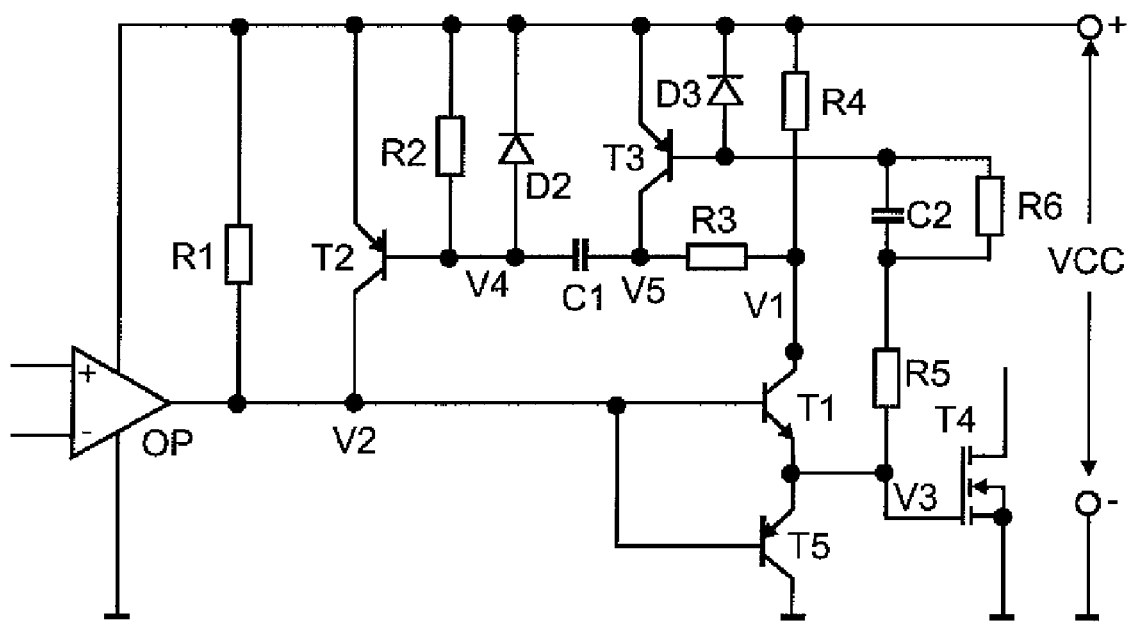
FIG. 3 shows the circuit diagram of a further variation of the circuit from FIG. 1 as a third exemplary embodiment.

FIG. 3 shows the circuit diagram of a variation of the circuits shown in FIGS. 1 and 2. The circuit shown in FIG. 3 is only slightly modified. Components which here have the same function as in the circuits shown in FIGS. 1 and 2 also still bear the same reference symbols.

In contrast to FIGS. 1 and 2, the diode D1 for discharging the gate capacitance of the voltage-controlled transistor T4 does not appear here. Instead, the emitter-collector path of a transistor T5 is connected between the control input of the voltage-controlled transistor T4 and the negative supply potential. The base of the transistor T5 is connected to the output of the operational amplifier OP.

When the voltage-controlled transistor T4 is switched off, the output of the operational amplifier OP assumes its low-impedance state, as a result of which the transistor T1 is switched off. The transistor T5 is switched on, however. The gate capacitance of the voltage-controlled transistor T4 is essentially discharged via the emitter-collector path of the transistor T5. In this case, the maximum possible discharge current corresponds to the product of the current-carrying capacity of the output of the operational amplifier OP and the current gain of the transistor T5.

The invention claimed is:

1. A circuit comprising a voltage-controlled transistor (T4), comprising:
   a first (+) and a second (−) supply potential (+,−);
   a first (T1) and a second transistor (T2); and
   an impedance (R4);
   wherein a series circuit (R4, T1) formed by a switching path of the first transistor (T1) and the impedance (R4) is coupled between the first supply potential (+) and a control input of the voltage-controlled transistor (T4), wherein the impedance (R4) is connected in a manner facing the first supply potential (+);
   wherein the first supply potential (+) is coupled to a control input of the first transistor (T1) via a switching path of the second transistor (T2);
   wherein a control input of the second transistor (T2) is coupled to a connecting node (V1) between the impedance (R4) and the switching path of the first transistor (T1) in such a way that a potential change at the connecting node (V1) switches the second transistor (T2);
   wherein the circuit is configured in such a way that:
      as a result of the first transistor (T1) being switched on in a manner mediated by means of a control signal, a first current flows through the series circuit (R4, T1) and starts to subject the control input of the voltage-controlled transistor (T4) to charge reversal in a first sense,
      the first current through the series circuit (R4, T1) brings about a first potential shift at the connecting node (V1),
      the second transistor (T2) is switched on by this first potential shift and a second current therefore flows through the switching path of the second transistor (T2) into the control input of the first transistor (T1), which amplifies the first current,
      the increasing charge reversal of the control input of the voltage-controlled transistor (T4) brings about a second potential shift at the connecting node (V1),
      the second transistor (T2) is switched off by this second potential shift, and
      the first transistor (T1) remains switched on and holds the voltage-controlled transistor (T4) in its new switching state; and
   wherein the circuit further comprises a first capacitor (C1) coupled between the connecting node (V1) and the control input of the second transistor (T2), the first capacitor being subjected to charge reversal by the first potential shift via a resistor (R3) in series with the first capacitor (C1) in such a way that it supports a switching off of the second transistor (T2) by the second potential shift.

2. The circuit as claimed in claim 1, in which the resistor (R3) connected in series with the first capacitor (C1) is configured in such a way that the charging time of the first capacitor (C 1) is shorter than the minimum duration for which the voltage-controlled transistor (T4) stays in its new switching state.

3. The circuit as claimed in claim 1, wherein the first transistor (T1) is switched on via an open collector output of an operational amplifier (OP) and a pull-up resistor (R1).

4. The circuit as claimed in claim 1, comprising a third transistor (T3), the control input of which is capacitively coupled to the control input of the voltage-controlled transistor (T4) and the switching path of which is coupled in series between the first supply potential (+) and the control input of the second transistor (T2), such that in the case of a potential shift in the direction of the second supply potential (−) at the control input of the voltage-controlled transistor (T4), the third transistor (T3) is switched on via its control input and a switching on of the second transistor (T2) is prevented.

5. The circuit as claimed in claim 4,
   wherein the first transistor (T1) is switched on via an open collector output of an operational amplifier (OP) and a pull-up resistor (R1); and
   wherein the first capacitor (C1) is coupled in a manner facing the control input of the second transistor (T2), and the resistor (R3) in series with the first capacitor (C1) is coupled in the manner facing the connecting node (V1) between the impedance (R4) and the switching path of the first transistor (T1), and wherein the switching path of the third transistor (T3) is coupled between the first supply potential (+) and a node (V5) between the first capacitor (C1) and the resistor (R3).

6. The circuit as claimed in claim 4, wherein the control input of the third transistor (T3) is coupled to the control input of the voltage-controlled transistor (T4) via a second capacitor (C2), and wherein a resistor (R6) is coupled in parallel with the second capacitor (C2) in order to increase the interference immunity.

7. The circuit as claimed in claim 6, wherein a first diode (D3) for discharging the second capacitor (C2) is coupled between the control input of the third transistor (T3) and the first supply potential (+).

8. The circuit as claimed in claim 1, wherein a second diode (D2) for discharging the first capacitor (C1) is coupled between the control input of the second transistor (T2) and the first supply potential (+).

9. The circuit as claimed in claim 1, wherein a resistor (R2) is coupled between the first supply potential and the control input of the second transistor (T2).

10. The circuit as claimed in claim 3, comprising a fourth transistor (T5), the switching path of which is coupled between the control input of the voltage-controlled transistor (T4) and the second supply potential (−), wherein the control input of the fourth transistor (T5) is coupled to the open collector output of the operational amplifier (OP) in such a way that the open collector output switches on the fourth transistor (T5) in order to subject the control input of the voltage-controlled transistor (T4) to charge reversal in the remaining second sense via the switching path of the fourth transistor (T5).

11. The circuit as claimed in claim 1, comprising a third diode (D1), wherein the circuit is designed to couple the third diode (D1) between the control input of the voltage-controlled transistor (T4) and the second supply potential via a switching path in order to subject said control input to charge reversal in the remaining second sense.

12. The circuit as claimed in claim 10 comprising a third transistor (T3), the control input of which is capacitively coupled to the control input of the voltage-controlled transistor (T4) and the switching path of which is coupled in series between the first supply potential (+) and the control input of the second transistor (T2), such that in the case of a potential shift in the direction of the second supply potential (−) at the control input of the voltage-controlled transistor (T4), the third transistor (T3) is switched on via its control input and a switching on of the second transistor (T2) is prevented; and
wherein at least one transistor from the group of the first (T1), the second (T2), the third (T3) and the fourth transistor (T5) is a bipolar transistor.

* * * * *